(12) United States Patent
Ozawa et al.

(10) Patent No.: US 6,702,865 B1
(45) Date of Patent: Mar. 9, 2004

(54) ALIGNMENT PROCESSING MECHANISM AND SEMICONDUCTOR PROCESSING DEVICE USING IT

(75) Inventors: Masahito Ozawa, Yamanashi-Ken (JP); Masaki Narushima, Sakaigawa-Mura (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/647,659
(22) PCT Filed: Apr. 2, 1999
(86) PCT No.: PCT/JP99/01766
§ 371 (c)(1),
(2), (4) Date: Oct. 4, 2000
(87) PCT Pub. No.: WO99/52143
PCT Pub. Date: Oct. 14, 1999

(30) Foreign Application Priority Data

Apr. 4, 1998 (JP) ............................................. 10-108579

(51) Int. Cl.⁷ .......................... H01L 21/00; H01L 21/64
(52) U.S. Cl. ...................... 29/25.01; 414/936; 414/937; 414/939; 414/940; 414/941
(58) Field of Search .......................... 29/25.01; 414/936, 414/937, 939, 990, 941

(56) References Cited

U.S. PATENT DOCUMENTS

| 5,110,249 A | * | 5/1992 | Norman |
| 5,202,716 A | * | 4/1993 | Tateyama et al. |
| 5,474,410 A | * | 12/1995 | Ozawa et al. |
| 5,643,366 A | * | 7/1997 | Somekh et al. |
| 5,803,932 A | * | 9/1998 | Akimoto et al. |
| 5,980,591 A | * | 11/1999 | Akimoto et al. |

FOREIGN PATENT DOCUMENTS

| JP | 1-251734 | 10/1989 |
| JP | 5-166917 | 7/1993 |
| JP | 5-178416 | 7/1993 |
| JP | 5-226455 | 9/1993 |
| JP | 5-343500 | 12/1993 |
| JP | 7-297258 | 11/1995 |
| JP | 7335717 | * 12/1995 |
| JP | 8-306767 | 11/1996 |
| JP | 9-40112 | 2/1997 |

OTHER PUBLICATIONS

International Preliminary Examination Report of International Appl. PCT/JP99/01766 in English Dated Nov. 24, 2000.

* cited by examiner

*Primary Examiner*—David E. Graybill
(74) *Attorney, Agent, or Firm*—Smith, Gambrell & Russell, LLP

(57) ABSTRACT

An alignment processing mechanism 10 according to the present invention includes: a conveying mechanism 11 for conveying a substrate W to be processed, an alignment mechanism 12 for aligning the substrate W conveyed by the conveying mechanism 11 to a predetermined direction, and a buffer mechanism 13 for relaying the substrate W from the conveying mechanism 11 to the alignment mechanism 12. The buffer mechanism 13 is adapted to temporarily hold the substrate W conveyed by the conveying mechanism 11, and to pass the temporarily holding substrate W to the alignment mechanism 12 based on a state of the alignment mechanism 12. According to the present invention, the alignment mechanism 12 can be used with greater efficiency in order to achieve a high speed of an alignment process.

17 Claims, 3 Drawing Sheets

ALIGNMENT PROCESSING MECHANISM AND SEMICONDUCTOR PROCESSING DEVICE USING IT

BACKGROUND OF THE INVENTION

1. Field of the Invention

This invention relates to an alignment processing mechanism and a semiconductor processing unit with the alignment processing mechanism, which can align a substrate to be processed to a predetermined direction before processing the substrate.

2. Disclosure of the Prior Art

In semiconductor manufacturing steps, processing units for a single substrate, which is adapted to process the single substrate such as a semiconductor wafer, are widely used. For example, a multi-chamber processing unit is known as a processing unit for a single substrate. For example, such a multi-chamber processing unit comprises: a carrier chamber for containing a carrier; an alignment chamber for taking a semiconductor wafer from the carrier contained in the carrier chamber and for conducting an alignment process to the semiconductor wafer; a conveying chamber connected to the alignment chamber via a load-lock chamber; and a plurality of processing chambers arranged around and connected to the conveying chamber. The plurality of processing chambers are adapted to continuously conduct a predetermined film-forming process or a predetermined etching process. Some multi-chamber processing units are adapted to conduct a conveyance of a semiconductor wafer, an alignment thereof and a process thereof, consistently under a reduced pressure at a predetermined vacuum level.

Herein, an alignment process is explained. In the alignment chamber, for example, a semiconductor wafer is taken out from the carrier contained in the carrier chamber via a conveying mechanism under an atmospheric pressure. Then, the semiconductor wafer is conveyed to an alignment mechanism. The alignment mechanism detects an orientation-flat (ori-fla) of the semiconductor wafer by means of a detector such as an optical sensor, and conducts an alignment process to the semiconductor wafer. That is, the alignment mechanism turns the semiconductor wafer to a predetermined direction. After conducted the alignment process, the semiconductor wafer is conveyed from the alignment mechanism to the load-lock chamber via the conveying mechanism. Then, the semiconductor wafer is conveyed from the load-lock chamber to a predetermined corresponding processing chamber via the conveying mechanism arranged in the conveying chamber under a reduced pressure. The semiconductor wafer undergoes a predetermined process in the processing chamber. The processed semiconductor wafer is contained in a carrier, which is adapted to contain processed semiconductor wafers, via the conveying chamber, the load-lock chamber and the alignment chamber.

SUMMARY OF THE INVENTION

However, generally, a speed of the alignment process may be a condition for determining a speed of entire sequential processes for the semiconductor wafer (if a time for which the alignment process is conducted is longer than a time for which the semiconductor wafer is processed). Whichever it may or not, in order to raise a throughput, it is an important point to shorten a waiting time (an idle time) of the alignment process. However, as described above, in the case that after the alignment process for a previous semiconductor wafer has been completed, a next semiconductor wafer is conveyed from the carrier chamber to the alignment mechanism, a time for which the next semiconductor wafer is conveyed from the carrier chamber to the alignment mechanism is an idle time of the alignment mechanism. Thus, there is a problem that the throughput is relatively low.

This invention is intended to solve the above problem effectively. The object of this invention is to provide an alignment processing mechanism, which can be used with greater efficiency in order to achieve such a high speed of an alignment process that a throughput may be raised.

In order to achieve the object, an alignment processing mechanism according to the invention is characterized by comprising: a conveying mechanism for conveying a substrate to be processed, an alignment mechanism for aligning the substrate conveyed by the conveying mechanism to a predetermined direction by causing the substrate to rotate, and a buffer mechanism for relaying the substrate from the conveying mechanism to the alignment mechanism.

According to another feature, the buffer mechanism is adapted to temporarily hold the substrate conveyed by the conveying mechanism and to pass the temporarily holding substrate to the alignment mechanism based on a situation of the alignment mechanism.

According to another feature, an alignment processing mechanism further comprises a second conveying mechanism for conveying the substrate aligned by the alignment mechanism.

According to another feature, the buffer mechanism has at least two holding members for holding the substrate in a vicinity of the alignment mechanism. In the case, preferably, the holding members are integratedly able to move vertically with respect to the alignment mechanism, in order to pass the substrate held thereby to the alignment mechanism. In addition, preferably, each of the holding members is adapted to rotate in such a manner that the holding member goes away from a space in which the substrate may move. In addition, preferably, each of the holding members has: a supporting surface for coming in contact with and supporting the reverse surface of the substrate, and a tapered surface inclined from the supporting surface and formed correspondingly to an outside periphery of the substrate.

According to another feature, an alignment mechanism has a stage for being placed the substrate, and a driving mechanism for causing the stage to rotate in a horizontal plane.

DESCRIPTION OF THE PREFERRED EMBODIMENT

Embodiments of the invention will now be described with reference to drawings.

Figure 1:
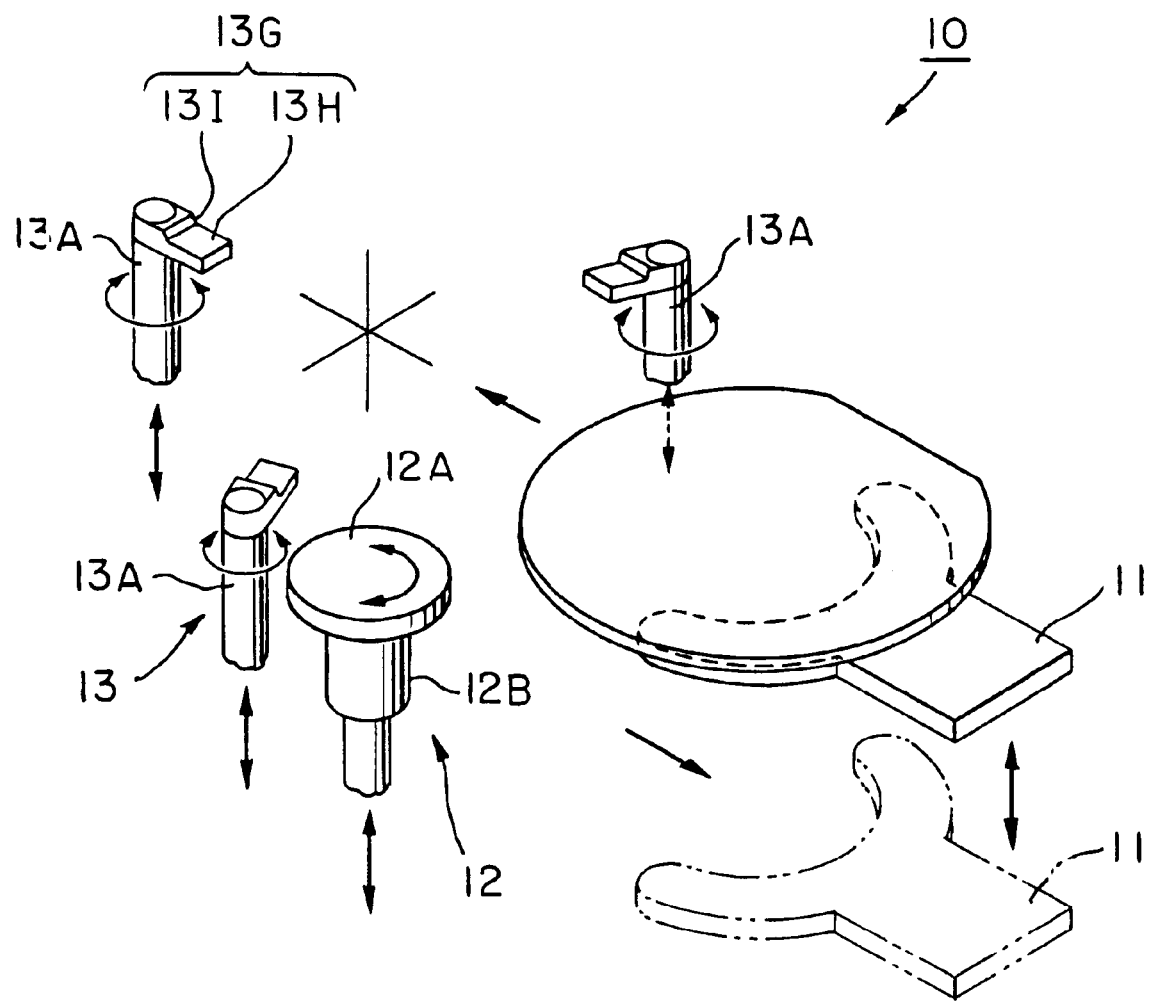
FIG. 1 is a perspective view of main parts of an embodiment of an alignment processing mechanism according to the invention.
Figure 2:
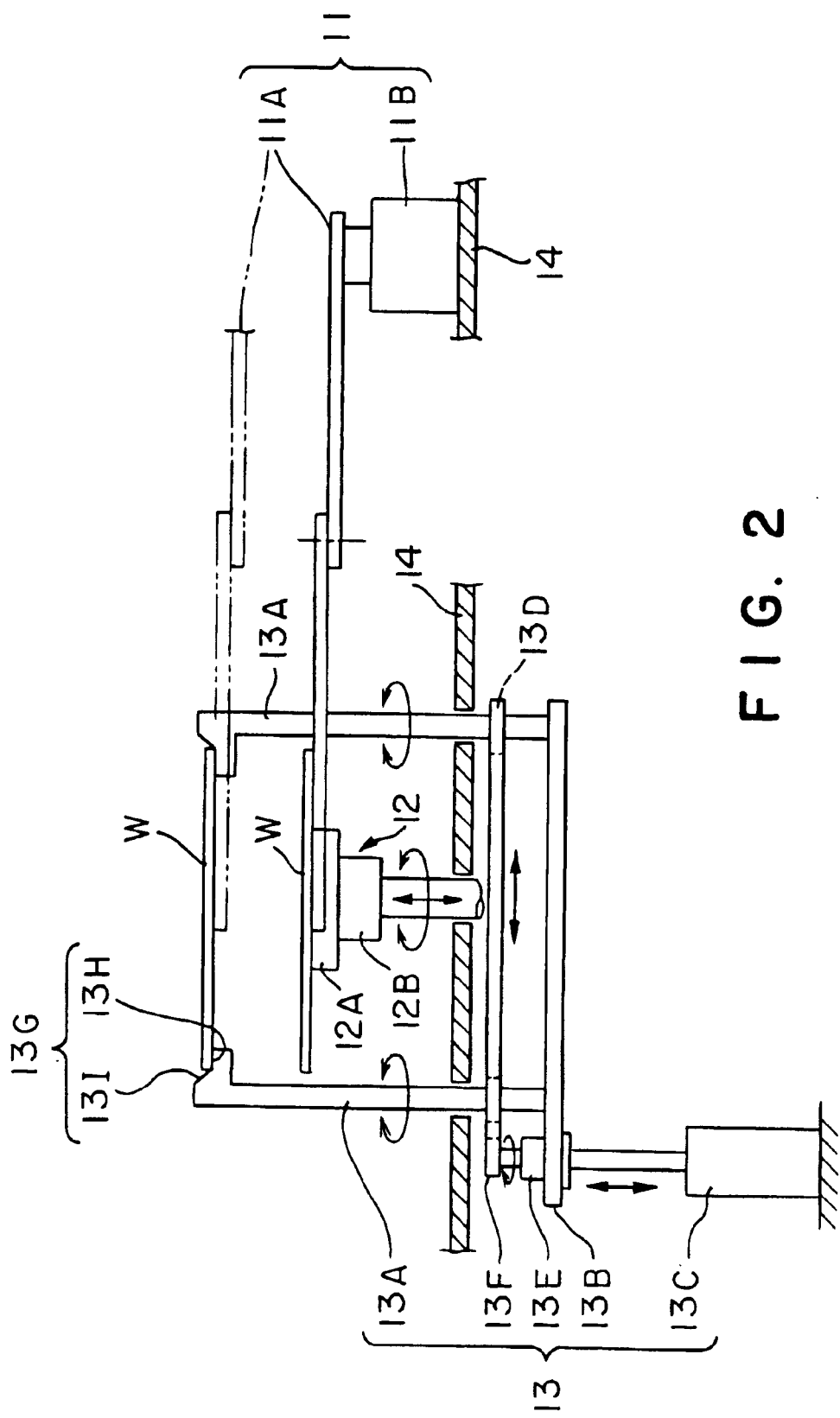
FIG. 2 is a sectional view of an entire structure of the embodiment of the alignment processing mechanism shown in FIG. 1.

For example, as shown in FIGS. 1 and 2, an alignment processing mechanism 10 of an embodiment of the invention comprises a conveying mechanism 11 for conveying a semiconductor wafer W, and an alignment mechanism 12 for aligning the semiconductor wafer W conveyed by the conveying mechanism 11 to a predetermined direction by using an orientation-flat as a standard.

As shown in FIG. 2, the conveying mechanism 11 includes a multi-joint arm 11A which can hold the semiconductor wafer W and which can extend and retract in a horizontal plane, a driving mechanism 11B which can cause the multi-joint arm 11A to rotate in a horizontal plane in regular and reverse directions (θ-direction) and to move in a vertical direction (Z-direction). The conveying mechanism 11 is adapted to adjust a height of the multi-joint arm 11A to a height for receiving a semiconductor wafer W by means of the driving mechanism 11B, to take out a semiconductor wafer W from a carrier one by one and to convey the semiconductor wafer W to the alignment mechanism 12. In addition, the conveying mechanism 11 is adapted to convey a semiconductor wafer W after conducted an alignment process to a predetermined position. If the conveying mechanism 11 operates under a predetermined vacuum level, it is preferable that the multi-joint arm 11A holds the semiconductor wafer W by means of an adsorbing means such as an electrostatic chuck. Alternatively, it is preferable that the multi-joint arm 11A operates with a semiconductor wafer only placed thereon. If the conveying mechanism 11 operates under an atmospheric pressure, it is preferable that the multi-joint arm 11A holds the semiconductor wafer W by means of a vacuum-adsorbing means. Alternatively, it is preferable that the multi-joint arm 11A operates with a semiconductor wafer placed thereon.

As shown in FIGS. 1 and 2, the alignment mechanism 12 has: a stage 12A for being placed a semiconductor wafer W, a driving mechanism 12B for causing the stage 12A to rotate in a regular direction or the reverse direction in a horizontal plane and to vertically move the stage 12A, a detector (not shown) such as an optical sensor for detecting an orientation-flat (including a notch) of the semiconductor wafer W while the driving mechanism 12B causes the stage 12A to rotate, and a controller (not shown) for stopping the driving mechanism 12B in such a manner that the semiconductor wafer W turns to a predetermined direction. The alignment mechanism 12 is adapted to detect the orientation-flat by means of the detector while causing the stage 12A to rotate in the regular direction or the reverse direction, and to align the semiconductor wafer W into the predetermined direction by means of the controller. If the alignment mechanism 12 operates in a predetermined vacuum state, it is preferable that the stage 12A holds the semiconductor wafer W by means of an adsorbing means such as an electrostatic chuck. Alternatively, if the alignment mechanism 12 operates in an atmospheric pressure, it is preferable that the stage 12A holds the semiconductor wafer W in a vacuum-absorption manner. In addition, in FIG. 2, a numerical sign 14 designates a floor plate in which the conveying mechanism 11 and the alignment mechanism 12 are arranged.

As shown in FIGS. 1 and 2, the alignment processing mechanism 10 also comprises a buffer mechanism 13 for temporarily holding the semiconductor wafer W. The buffer mechanism 13 is adapted to relay the semiconductor wafer W from the conveying mechanism 11 to the alignment mechanism 12. The buffer mechanism 13 has: three supporting pins 13A (holding members) which stand around the stage 12A of the alignment mechanism 12 at substantially regular intervals in a peripheral direction thereof and whose upper portions have holding members 13G that can support a reverse surface of the semiconductor wafer W respectively, a ring-shaped connecting member 13B for connecting and unifying lower ends of the supporting pins 13A with each other in such a manner that each of the supporting pins 13A can rotate relatively to the connecting member 13B, and an elevating mechanism 13C (for example, an air cylinder) connected to the connecting member 13B. The air cylinder 13C is fixed below the floor plate 14 and adapted to cause the holding pins 13A to vertically move integratedly between upper and lower portions for passing or receiving the semiconductor wafer W. Then, the three supporting pins 13A are adapted to hold the semiconductor wafer W in such a manner that a center of the semiconductor wafer W is located on an extending line of an axis of the stage 12A of the alignment mechanism 12. Thus, when the three supporting pins 13A are caused to move downward by means of the air cylinder 13C, the semiconductor wafer W is passed onto the stage 12A in such a manner that the center of the semiconductor wafer W is located on a center of the stage 12A.

The holding members 13G are fixed to the supporting pins 13A at upper ends of the supporting pins 13A, respectively. In an upper surface of each of the holding members 13G, a supporting surface 13H for supporting the semiconductor wafer W and a tapered surface 13I inclined from the supporting surface 13H to an outside periphery of the semiconductor wafer W are formed. Thus, the tapered surface 13I functions as a guide surface for guiding the semiconductor wafer onto the supporting surface 13H. Each of the holding members 13G may be formed integrally with a corresponding supporting pin 13A.

A line defined by a boundary between the tapered surface 13I and the supporting surface 13H may be a straight line perpendicular to a diameter of the semiconductor wafer W or an arc correspondingly to the outside periphery of the semiconductor wafer W. That is, it is enough for the line to substantially correspond the outside periphery of the semiconductor wafer W.

However, each of the supporting pins 13A is connected to the connecting member 13B in a manner rotatable in the regular and the reverse directions. Then, a pulley 13D is attached to each of the supporting pins 13A, a motor 13E rotatable in a regular and the reverse directions is attached to the connecting member 13B, and an endless belt 13F is rolled around the pulley 13D and an output pulley of the motor 13E. Thus, as shown by an arrow in FIG. 2, each of the supporting pins 13A is adapted to rotate in the regular or the reverse direction via the endless belt 13F when the motor 13E rotates in the regular or the reverse direction.

Each of the holding members 13G turns to an inside direction or an outside direction relative to an area surrounded by the supporting pins 13A depending on it that each of the supporting pins 13A rotates in the regular or the reverse direction. When each of the holding members 13G turns to the outside direction, the holding members 13G are evacuated outside from a relative moving space of the semiconductor wafer W. That is, the holding members are arranged in such a manner that the semiconductor wafer W can relatively vertically move among the supporting pins 13A.

The supporting pins 13A are arranged around the stage in such a manner that an inscribed circle of the supporting pins 13A can surround the substrate. It is preferable that at least one of intervals between any two of the supporting pins 13A is an interval through which the substrate held by the conveying means can move. According to the structure, the conveying means can take out an aligned substrate from on the stage with the holding members holding the aligned substrate.

In the embodiment, the number of the supporting pins is three, but the invention is not limited by the manner. The invention can adopt one supporting pin that can support a circular holding member. In addition, the invention can adopt two or four or more supporting pins. However, if the holding member is supported by the one supporting pin, a movement for evacuating the holding member from the moving space of the substrate tends to be large. Thus, there is a drawback that a time for the movement tends to be long. In the view of this, it is preferable that a plurality of supporting pins support a plurality of holding members. If four supporting pins are arranged, it is preferable that the four supporting pins are arranged at corners of a rectangle (including a square) surrounding the stage, respectively, and that two intervals between the supporting pins 13A corresponding to two longer sides of the rectangle are intervals through which the substrate held by the conveying means can move. In the case, the substrate can be transferred onto or from on the stage on both opposite sides of the stage.

Figure 3:
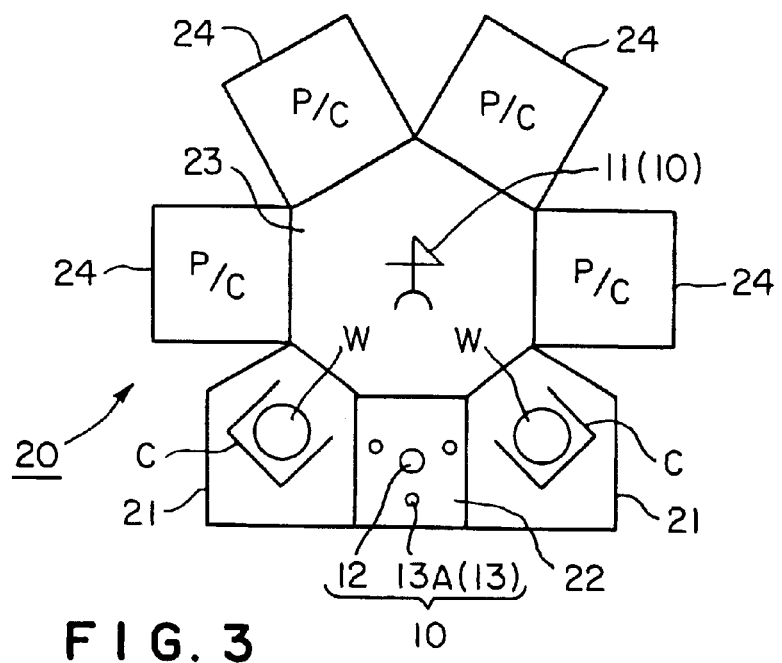
FIG. 3 is a plan view of an example of a processing unit using the alignment processing mechanism shown in FIG. 1.

Next, a multi-chamber processing unit (hereafter, it is abbreviated as "processing unit") using the above alignment high-speed processing mechanism 10 is described with reference to FIG. 3. As shown in FIG. 3, the processing unit 20 comprises: right and left carrier chambers 21 for containing semiconductor wafers W every carrier; an alignment chamber 22 located between them; a conveying chamber 23 having seven side surfaces, adjacent three of which are connected to the carrier chambers 21 and the alignment chamber 22, respectively; and four processing chambers 24 connected to the rest four side surfaces of the conveying chamber 23, respectively. In the processing unit 20, conveyance and alignment of the semiconductor wafer W are adapted to be conducted in a predetermined vacuum state.

The alignment mechanism 12 and the buffer mechanism 13 of the alignment processing mechanism 10 are arranged in the alignment chamber 22, respectively. The conveying mechanism arranged in the conveying chamber conveys the wafer to the alignment processing mechanism. Thus, before the semiconductor wafer W undergoes a process in the processing chambers 24, the alignment process for the semiconductor wafer W can be conducted at a high speed. One of the processing chambers 24 may be for example a plasma-processing chamber, wherein a predetermined circuit film or a predetermined insulating film may be formed on a surface of the semiconductor wafer W and/or unnecessary portion of the formed film may be removed.

Next, an operation of the processing unit 20 is described. At first, the carrier chambers 21, the alignment chamber 22, the conveying chamber 23 and the processing chambers 24 are produced a vacuum. Each of the chambers is maintained at a predetermined reduced pressure, respectively. Then, the semiconductor wafer W is conveyed and aligned under the predetermined reduced pressure. That is, the conveying mechanism 11 operates so that the multi-joint arm 11A extends and/or retracts via the driving mechanism 11B to take out a semiconductor wafer W from a carrier C in a carrier chamber 21 into the conveying chamber 23. Then, the multi-joint arm 11A is caused to rotate so that the semiconductor wafer W turns to the buffer mechanism 13 as shown by real lines in FIG. 1. At that time, the multi-joint arm 11A and each of the supporting pins 13A are caused to vertically move relative to each other so that the height of the multi-joint arm 11A and the heights of the supporting pins 13A are adjusted for enabling the semiconductor wafer to be passed between the multi-joint arm 11A and the supporting pins 13A.

Then, the multi-joint arm 11A extends to convey the semiconductor wafer W just above the holding members 13G of the three supporting pins 13A. After that, the multi-joint arm 11A is caused to move downward a little via the driving mechanism 11B so that the semiconductor wafer W is passed to the buffer mechanism 13 as shown by dashed lines in FIG. 2. At that time, all the holding members 13G of the supporting pins 13A turn to the inside direction. Thus, the three supporting surfaces 13H support a peripheral area of the reverse surface of the semiconductor wafer W. Then, the multi-joint arm 11A moves back from the buffer mechanism 13. Even if a position of the semiconductor wafer W and positions of the supporting pins 13A are not coincident a little when the semiconductor wafer W is passed to the buffer mechanism 13, the semiconductor wafer W is guided onto the respective supporting surfaces 13H by the respective tapered surfaces 13I of the holding members 13G. Thus, the three supporting pins 13A can surely support the semiconductor wafer W by means of the supporting surfaces 13H.

When the buffer mechanism 13 receives the semiconductor wafer W, the air cylinder 13C operates so that each of the supporting pins 13A is caused to move downward to a position for passing the semiconductor wafer W onto the stage 12A. Then, the semiconductor wafer W is placed on the stage 12A. Then, the stage 12A is caused to move upward a little with holding the semiconductor wafer W, and to rotate. While the stage 12A is rotated, the detector detects the orientation-flat of the semiconductor wafer W and the controller controls rotation of the stage 12A to align the semiconductor wafer W.

During the alignment process, the buffer mechanism 13 and the conveying mechanism 11 operates. That is, the motor 13E of the buffer mechanism 13 operates to cause the three supporting pins 13A to rotate, for example by 180 degrees, via the endless belt 13F. Thus, the supporting surfaces 13H of the holding members 13G turn to the outside direction of the semiconductor wafer W, respectively. After the holding members 13G are evacuated from the semiconductor wafer W, each of the supporting pins 13A is caused to move upward to a position for receiving the semiconductor wafer W from the conveying mechanism 11, by means of the air cylinder 13C. Then, a next semiconductor wafer W conveyed from the carrier chamber 21 by the conveying mechanism 11 is passed to the buffer mechanism 13 via the multi-joint arm 11A, in the same way as described above. The next semiconductor wafer W is temporarily held by the buffer mechanism 13, in the same way as described above.

After the alignment process for the semiconductor wafer W is completed in the alignment chamber 22, the multi-joint arm 11A of the conveying mechanism 11 is caused to move downward to a position for receiving the semiconductor wafer W from on the stage 12A, by means of the driving mechanism 11B. The multi-joint arm 11A extends to the stage 12A as shown by real lines in FIG. 2, to receive the semiconductor wafer W that has been aligned. Then, the multi-joint arm 11A moves back together with the semiconductor wafer W from the alignment chamber 22, and conveys the semiconductor wafer W into a predetermined processing chamber 24. After the multi-joint arm 11A has moved back from the processing chamber 24, a process for the semiconductor wafer W starts in the processing chamber 24. Just after the multi-joint arm 11A has received the semiconductor wafer W from on the stage 12A, the buffer mechanism 13 operates to pass the next semiconductor wafer W, which has been temporarily held thereby, onto the stage 12A in the same way as described above. Then, the alignment mechanism 12 conducts an alignment process for the next semiconductor wafer W.

During the alignment process, the conveying mechanism 11 may convey the semiconductor wafer W from the carrier chamber 21 to the buffer mechanism 13, or may convey the processed semiconductor wafer W from the processing chamber 24 to a carrier C for containing processed semiconductor wafers W contained in the other carrier chamber 21. After the alignment process, as described above, just after the semiconductor wafer W has been taken out, the next semiconductor wafer is passed from the buffer mechanism 13 to the alignment mechanism 12.

As described above, according to the embodiment, since the buffer mechanism 13 is provided for temporarily holding the semiconductor wafer W just before undergoing the alignment process, the next semiconductor wafer W can be passed from the conveying mechanism 11 to the buffer mechanism 13 while the alignment process for the former semiconductor wafer W is conducted in the alignment mechanism 12. Thus, just after the alignment process for the former semiconductor wafer W has been completed, the alignment process for the next semiconductor wafer W can be started. That is, a waiting time of the alignment mechanism 12 can be removed or shortened so that the alignment mechanism 12 can be continuously used more efficiently. Thus, the alignment process for the semiconductor wafer W can be conducted at a high speed. Therefore, throughput for processing the semiconductor wafer W can be raised.

Figure 4:
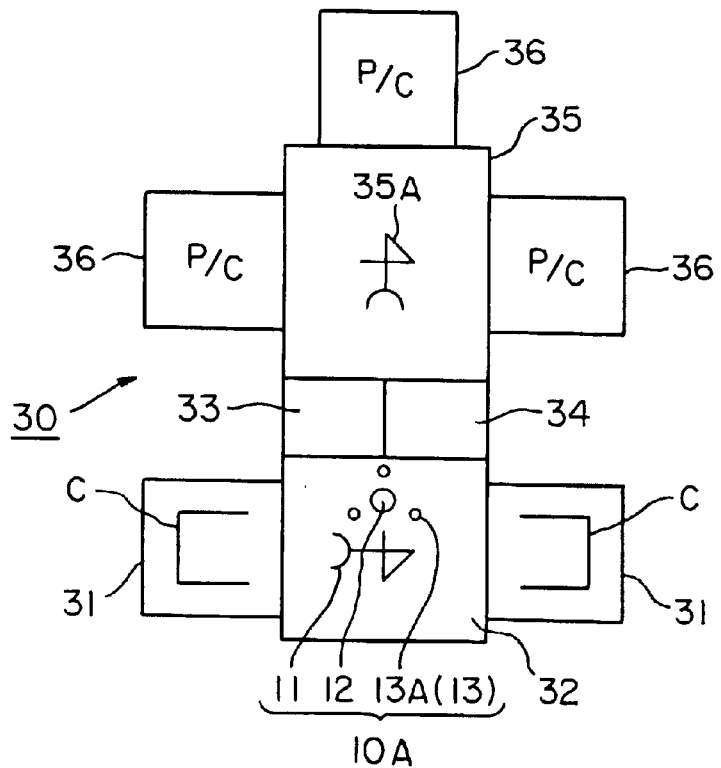
FIG. 4 is a plan view of an example of a processing unit using another embodiment of an alignment processing mechanism according to the invention.

FIG. 4 is a plan view of a processing unit 30 applying another embodiment of an alignment processing mechanism 10 according to the invention. As shown in FIG. 4, the processing unit 30 comprises: right and left carrier chambers 31 for containing semiconductor wafers W every carrier; an alignment chamber 32 located between them; a conveying chamber 35 connected to the alignment chamber 32 via right and left load-lock chambers 33, 34; and processing chambers 36 connected to the rest side surfaces of the conveying chamber 35, respectively. In the processing unit 30, an alignment process for the semiconductor wafer W is adapted to be conducted under an atmospheric pressure.

The alignment processing mechanism 10A of the embodiment comprises a second conveying mechanism 35A arranged in the conveying chamber 35 besides a conveying mechanism 11, an alignment mechanism 12 and a buffer mechanism 13. A feature of conveying a semiconductor wafer W before aligned to the buffer mechanism 13 via the conveying mechanism 11 is the same as the previous embodiment. However, a feature of conveying a semiconductor wafer W after aligned via the second conveying mechanism 35A is different from the previous embodiment. That is, although the conveying mechanism 11 of the previous embodiment has an elevating mechanism that can cause the multi-joint arm 11A to vertically move, the conveying mechanism 11, 35A of the embodiment don't have an elevating mechanism that can cause the multi-joint arm to vertically move. In the embodiment, respective multi-joint arms pass and/or receive a semiconductor wafer W at respective predetermined constant heights. In addition, in the alignment processing mechanism 10A, the semiconductor wafer W is adapted to be aligned under the atmospheric pressure as described above, and the semiconductor wafer W after aligned is adapted to be conveyed in a predetermined vacuum state.

Supporting pins 13A are arranged around a stage in such a manner that an inscribed circle of the supporting pins 13A can surround the substrate. It is preferable that at least one of intervals between any two of the supporting pins 13A is an interval through which the substrate held by the conveying means can move. According to the structure, the conveying means can take out an aligned substrate from on the stage with holding members holding the aligned substrate.

In the embodiment, the number of the supporting pins is three, but the invention is not limited by the manner. The invention can adopt one supporting pin that can support a circular holding member. In addition, the invention can adopt two or four or more supporting pins. However, if the holding member is supported by the one supporting pin, a movement for evacuating the holding member from a moving space of the substrate tends to be large. Thus, there is a drawback that a time for the movement tends to be long. In the view of this, it is preferable that a plurality of supporting pins support a plurality of supporting members. If four supporting pins are arranged, it is preferable that the four supporting pins are arranged at corners of a rectangle (including a square) surrounding the stage, respectively, and that two intervals between the supporting pins 13A corresponding to two longer sides of the rectangle are intervals through which the substrate held by the conveying means can move. In the case, the substrate can be moved onto or from on the stage on both opposite sides of the stage.

The multi-joint arm 11 takes out a first semiconductor wafer W from a carrier C containing a plurality of semiconductor wafers and puts the first semiconductor wafer W on the stage 12A of the alignment mechanism. While the first semiconductor wafer W is aligned, the multi-joint arm 11 takes out a second semiconductor wafer W from the carrier C and passes the second semiconductor wafer W to the holding members of the supporting pins 13A. After an alignment process for the first semiconductor wafer W is completed, the multi-joint arm 11 takes out the first semiconductor wafer W from on the stage 12A, and conveys the first semiconductor wafer W into the load-lock chamber 33. The next semiconductor wafer W temporarily held by the supporting pins 13A is immediately conveyed onto the stage 12A and undergoes an alignment process. While the alignment process, the multi-joint arm takes out a third semiconductor wafer W from the carrier C, and passes the third semiconductor wafer W to the supporting pins 13A. The load-lock chamber 33 is closed after the first semiconductor wafer W is conveyed thereinto. Then, an inside of the load-lock chamber 33 is vacuumed to a predetermined vacuum level. Then, a gate of the load-lock chamber 33 on a side of a multi-joint arm 35A is opened, and the first semiconductor wafer W is taken out by the multi-joint arm 35A. The semiconductor wafer W is conveyed into a predetermined processing chamber 36 by the multi-joint arm 35A to undergo a predetermined process. The semiconductor wafer W after undergoing the process is taken out from the processing chamber by the multi-joint arm 35A, and is conveyed via the load-lock chamber 34 to the carrier C by the multi-joint arm 11.

The embodiment also has the same functions and effects as the previous alignment processing mechanism 10.

As another embodiment of a semiconductor processing unit, besides the alignment mechanism described above, a system may further comprise a containing means for containing substrates and a processing chamber for processing the substrates, wherein the containing means, the alignment means and the processing chamber may be arranged on substantially the same straight line. In a typical example, a wafer-carrier as a containing means, an alignment mechanism and a processing chamber are arranged in that order. If necessary, a load-lock means are arranged between the alignment mechanism and the processing chamber.

A conveying means is provided in a vicinity of the alignment mechanism. If the unit has the load-lock means, another conveying means is provided between the load-lock means and the processing chamber.

In addition, in each of the embodiments described above, when the semiconductor wafer W is passed from the buffer mechanism 13 to the alignment mechanism 12, the supporting pins 13A of the buffer mechanism 13 rotate so that the supporting members 13G are evacuated from the semiconductor wafer W. However, the supporting pins 13A may be arranged in such a manner that each of the supporting pins 13A can move in a radial direction of the semiconductor wafer W. Alternatively, the supporting pins 13A may be arranged in such a manner that each upper end of the supporting pins 13A can tilt outward in order to evacuate the supporting member from the moving space of the semiconductor wafer. In addition, it is enough that the alignment mechanism 12 and the buffer mechanism 13 can vertically move with respect to each other, that is, it is not necessary for the alignment mechanism 12 to have an elevating mechanism.

In each of the embodiments described above, the buffer mechanism holds the substrate right above the stage. In the case, the buffer mechanism has to move only in a vertical direction in order to pass the substrate onto the stage. Thus, the embodiments have an advantage of a less horizontal positional error. However, the invention is not limited by the manner. It is enough that a position for the buffer mechanism to temporarily hold the substrate is near the stage. For example, the position may be located diagonally above the stage. In the case, it is necessary to provide a means for causing the buffer mechanism to move in a diagonal downward direction when the substrate is passed onto the stage.

As a typical semiconductor processing unit using the invention, there are a CVD unit and a plasma etching unit. In addition, the invention can be used in a wafer-prober, a coater-developper, a pattern-exposure unit, or any general unit necessary to conduct any alignment process to a substrate.

In each of the embodiments described above, the multi-joint arm is used as the conveying means. However, a belt-conveying mechanism may be used.

In each of the embodiments described above, the processing unit is a vacuum processing unit for the semiconductor wafer. However, the invention may be used in a processing unit for a square substrate such as a substrate for a liquid-crystal display. In addition, besides the vacuum processing unit, the invention may be widely used in any general semiconductor processing unit including a semiconductor manufacturing unit and a semiconductor testing unit, which is necessary to conduct an alignment process to a substrate.

What is claimed is:

1. An alignment processing mechanism comprising:
   a conveying mechanism for conveying a substrate to be processed,
   an alignment mechanism for detecting an orientation-flat of the substrate conveyed by the conveying mechanism and for aligning the orientation-flat to a predetermined direction by causing the substrate to rotate, and
   a buffer mechanism for relaying the substrate from the conveying mechanism to the alignment mechanism,
   wherein the buffer mechanism temporarily holds the substrate conveyed by the conveying mechanism, and passes the substrate to the alignment mechanism by changing a relative position of the substrate to the alignment mechanism based on a state of the alignment mechanism, in such a manner that a center of the substrate is located on a rotational axis of the alignment mechanism.

2. An alignment processing mechanism according to claim 1, further comprising:
   a second conveying mechanism for conveying the substrate aligned by the alignment mechanism.

3. An alignment processing mechanism according to claim 1, wherein:
   the buffer mechanism has at least two holding members for holding the substrate in a vicinity of the alignment mechanism.

4. An alignment processing mechanism according to claim 3, wherein:
   the holding members are integratedly able to move vertically with respect to the alignment mechanism, in order to pass the substrate held thereby to the alignment mechanism.

5. An alignment processing mechanism according to claim 3, wherein:
   each of the holding members has a supporting member for supporting a reverse surface of the substrate.

6. An alignment processing mechanism according to claim 5, wherein:
   the supporting member of each of the holding member is adapted to rotate in such a manner that the supporting member goes away from the reverse surface of the substrate.

7. An alignment processing mechanism according to claim 6, wherein:
   each of the holding members has: a supporting surface for coming in contact with and supporting the reverse surface of the substrate, and a tapered surface inclined from the supporting surface and formed correspondingly to an outside periphery of the substrate.

8. An alignment processing mechanism according to claim 7, wherein:
   an alignment mechanism has a stage for being placed the substrate, and a driving mechanism for causing the stage to rotate in a horizontal plane.

9. A semiconductor processing unit comprising:
   an alignment means for placing a substrate to be processed onto a stage, for detecting an orientation-flat of the substrate, and for aligning the orientation-flat to a predetermined direction by causing the stage to rotate,
   a buffer means for temporarily holding another substrate in a vicinity of the stage while the alignment process is conducted,
   a means for moving the stage and the buffer means relatively to each other and placing the substrate held by the buffer means onto the stage in such a manner that a center of the substrate is located on a rotational axis of the stage, and
   at least a conveying moans for passing or receiving the substrate to or from the alignment means and/or the buffer means.

10. A semiconductor processing unit according to claim 9, wherein:
    the buffer means has:
    a plurality of holding members arranged around the stage and capable of holding the substrate, and
    a means for switching a position of the plurality of holding members between a first position wherein the plurality of holding members hold the substrate and a second position wherein the plurality of holding members are away from a space in which the substrate may move.

11. A semiconductor processing unit according to claim 10, wherein:

each of the plurality of holding members is provided at an upper portion of each of a plurality of supporting members vertically standing around the stage and at substantially regular intervals with respect to a peripheral direction, and at least one of intervals between any two of the plurality of supporting members under a situation that the plurality of holding members are located higher than the stage is an interval through which the substrate held by the conveying means can move.

12. A semiconductor processing unit according to claim 10, wherein:

each of the plurality of holding members has
a holding surface for supporting a peripheral portion of a reverse surface of the substrate when the plurality of holding members are located at the first position, and
a tapered portion formed by a slope extending outward and upward from the holding surface, and
a border between the holding surface and the tapered portion forms a line substantially corresponding to an outside periphery of the substrate while the substrate is held.

13. A semiconductor processing unit according to claim 9, further comprising:

a first conveying means for passing the substrate to the buffer means, and a second conveying means for receiving the substrate from the stage.

14. A semiconductor processing unit according to claim 9, further comprising:

a containing means for containing a plurality of substrates, and a processing chamber for conducting a process to a substrate, wherein the containing means, the alignment means and the processing chamber are arranged on substantially a straight line.

15. A semiconductor processing unit according to claim 9, further comprising:

a plurality of containing means, each of which is adapted to contain a plurality of substrates, and a plurality of processing chambers, each of which is adapted to conduct a process to a substrate, wherein the plurality of containing means, the alignment means and the plurality of processing chambers are arranged around the conveying means.

16. A semiconductor processing unit according to 9, further comprising:

an alignment chamber having the alignment means, the buffer means and a first conveying means, a containing means arranged adjacently to the alignment chamber, for containing the substrate, a load-lock means arranged adjacently to the alignment chamber, a conveying chamber arranged adjacently to the load-lock means, having a second conveying means, and a vacuum processing chamber arranged adjacently to the conveying chamber, for conducting a vacuum process to the substrate, wherein the first conveying means removes the substrate from the containing means, passes the substrate to the buffer means, receives the substrate from the stage of the alignment means and conveys the substrate to the load-lock means, and the second conveying means receives the substrate from the load-lock means and conveys the substrate to the vacuum process chamber.

17. An alignment processing mechanism comprising:

a conveying mechanism for conveying a substrate to be processed, an alignment mechanism for aligning the substrate conveyed by the conveying mechanism to a predetermined direction by causing the substrate to rotate, and a buffer mechanism for relaying the substrate from the conveying mechanism to the alignment mechanism, wherein the buffer mechanism is adapted to temporarily hold the substrate conveyed by the conveying mechanism, and to pass the temporarily holding substrate to the alignment mechanism by changing a relative position of the substrate to the alignment mechanism based on a state of the alignment mechanism, in such a manner that a center of the substrate is located on a rotational axis of the alignment mechanism, wherein the buffer mechanism surrounds a space through which the alignment mechanism is moved.

* * * * *